(12) United States Patent
McTeer et al.

(10) Patent No.: US 12,432,984 B2
(45) Date of Patent: Sep. 30, 2025

(54) MICROELECTRONIC DEVICES INCLUDING STACK STRUCTURES HAVING DOPED INTERFACIAL REGIONS, AND RELATED SYSTEMS AND METHODS

(71) Applicant: Micron Technology, Inc., Boise, ID (US)

(72) Inventors: Everett A. McTeer, Eagle, ID (US); Farrell M. Good, Meridian, ID (US); John M. Meldrim, Boise, ID (US); Jordan D. Greenlee, Boise, ID (US); Justin D. Shepherdson, Meridian, ID (US); Naiming Liu, Boise, ID (US); Yifen Liu, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 651 days.

(21) Appl. No.: 17/804,530

(22) Filed: May 27, 2022

(65) Prior Publication Data

US 2023/0387229 A1  Nov. 30, 2023

(51) Int. Cl.
*H10D 30/69* (2025.01)
*H10B 43/27* (2023.01)
*H10D 64/01* (2025.01)

(52) U.S. Cl.
CPC .......... *H10D 30/694* (2025.01); *H10B 43/27* (2023.02); *H10D 64/037* (2025.01)

(58) Field of Classification Search
CPC ...... H10B 43/27; H10D 30/69; H10D 30/694; H10D 64/031; H10D 64/037
See application file for complete search history.

(56) References Cited

U.S. PATENT DOCUMENTS

| 10,777,576 B1* | 9/2020 | Kim | G11C 16/08 |
| 2015/0001613 A1* | 1/2015 | Yip | H10B 43/50 |
| | | | 257/329 |

OTHER PUBLICATIONS

Entegris White Paper, "Considerations for Improving 3D NAND Performance, Reliability, and Yield", https://info.entegris.com/white-paper-considerations-for-improving-3d-nand-performance-yield-and-reliability (Jun. 7, 2019) 7 pages.

* cited by examiner

*Primary Examiner* — Wasiul Haider
(74) *Attorney, Agent, or Firm* — TraskBritt

(57) ABSTRACT

A microelectronic device comprises conductive structures and insulative structures vertically alternating with the conductive structures. At least one of the insulative structures includes interfacial regions extending inward from vertical boundaries of the at least one of the insulative structures, and central region vertically interposed between the interfacial regions. The interfacial regions are doped with one or more of carbon and boron. The insulative structures comprise a lower concentration of the one or more of carbon and boron than the interfacial regions. Additional microelectronic devices, electronic systems, and methods are also described.

11 Claims, 11 Drawing Sheets

US 12,432,984 B2

MICROELECTRONIC DEVICES INCLUDING STACK STRUCTURES HAVING DOPED INTERFACIAL REGIONS, AND RELATED SYSTEMS AND METHODS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory (NVM) devices, such as flash memory devices (e.g., NAND flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including structures of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

In some cases, chemical erosion, which can result from etching processes and/or material migration (e.g., fluorine migration, chlorine migration), undesirably effectuates voids in dielectric materials associated with a vertical memory array. The voids may negatively impact the structural integrity of a device including the vertical memory array and/or may facilitate shorts between the conductive structures through the dielectric materials. In some cases, one or more tiers of structures associated with the vertical memory array may undesirably collapse during the formation process, such as during or after so called "replacement gate" processing.

BRIEF DESCRIPTION OF THE DRAWINGS

While the specification concludes with claims particularly pointing out and distinctly claiming embodiments of the present disclosure, the advantages of embodiments of the disclosure may be more readily ascertained from the following description of embodiments of the disclosure when read in conjunction with the accompanying drawings in which:

DETAILED DESCRIPTION

Figure 1:
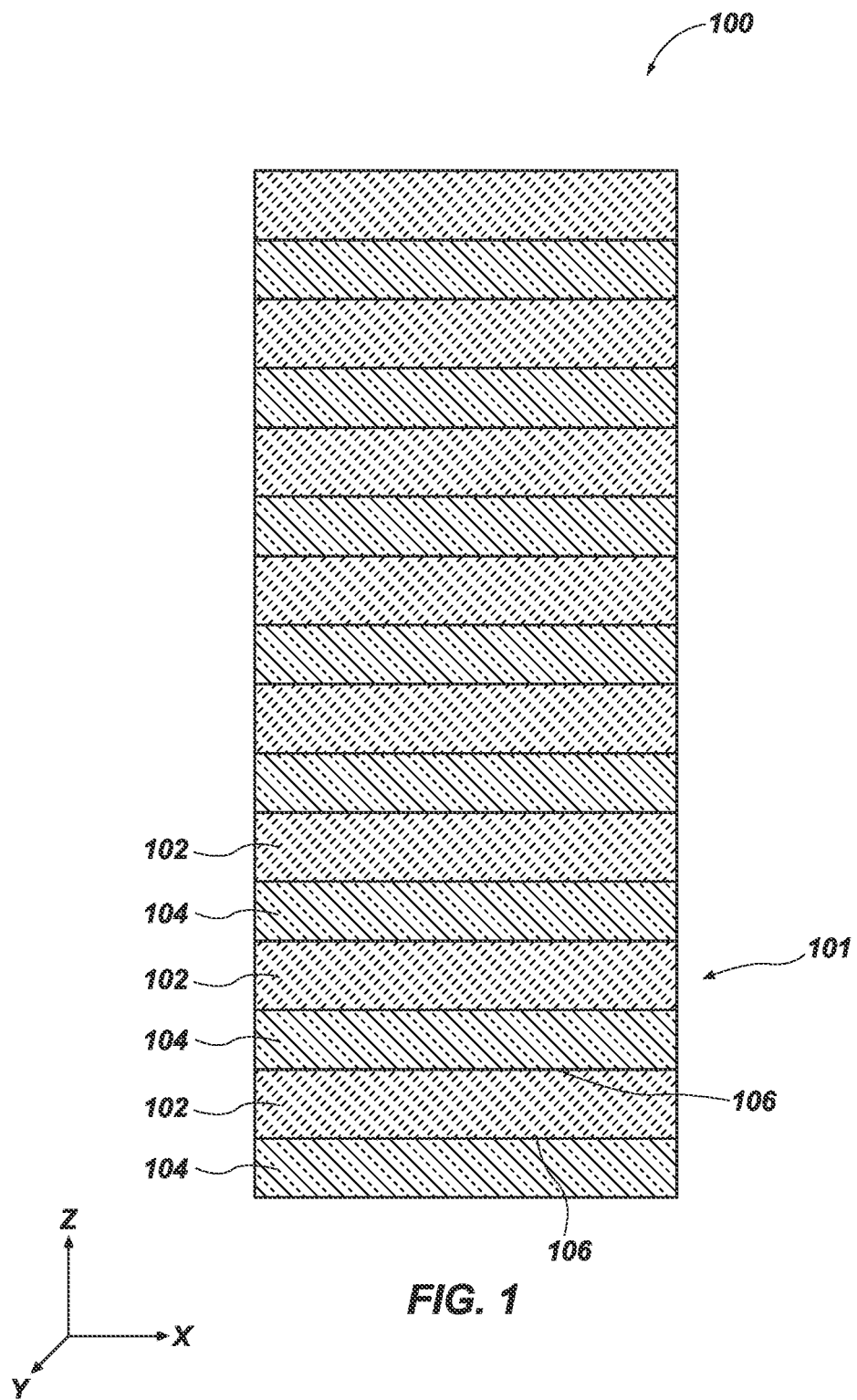
FIG. 1 is a simplified, partial cross-sectional view of a microelectronic device structure for a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional non-volatile memory; conventional volatile memory), but also includes an application specific integrated circuit (ASIC) (e.g., a system on a chip (SoC)), a microelectronic device combining logic and memory, and a graphics processing unit (GPU) incorporating memory.

As used herein, the terms "configured" and "configuration" refers to a size, a shape, a material composition, a material distribution, orientation, and arrangement of at least one feature (e.g., one or more of at least one structure, at least one material, at least one region, at least one device) facilitating use of the at least one feature in a pre-determined way.

As used herein, the term "substantially" in reference to a given parameter, property, or condition means and includes to a degree that one skilled in the art would understand that the given parameter, property, or condition is met with a small degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, relational terms, such as "beneath," "below," "lower," "bottom," "above," "upper," "top," "front," "rear," "left," "right," and the like, may be used for ease of description to describe one element's or feature's relationship to another element(s) or feature(s) as illustrated in the drawings. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the term "and/or" means and includes any and all combinations of one or more of the associated listed items.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the drawings, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1 illustrates a simplified, partial cross-sectional view of a microelectronic device structure 100 at a processing stage of a method of forming a microelectronic device (e.g., a memory device, such as a 3D NAND Flash memory device) of the disclosure, in accordance with embodiments of the disclosure. The microelectronic device structure 100 may include a preliminary stack structure 101 including insulative structures 104 and sacrificial structures 102 (e.g., additional dielectric structures) vertically alternating (e.g., in the Z-direction) with the insulative structures 104.

The sacrificial structures 102 of the preliminary stack structure 101 may be formed of and include at least one material (e.g., at least one insulative material) that may be selectively removed relative to additional material (e.g., at least one additional insulative material) of the insulative structures 104. A material composition of the sacrificial structures 102 is different than a material composition of the insulative structures 104. The sacrificial structures 102 may be selectively etchable relative to the insulative structures 104 during common (e.g., collective, mutual) exposure to a first etchant, and the insulative structures 104 may be selectively etchable relative to the sacrificial structures 102 during common exposure to a second, different etchant. As used herein, a material is "selectively etchable" relative to another material if the material exhibits an etch rate that is at least about three times (3×) greater than the etch rate of another material, such as about five times (5×) greater, such as about ten times (10×) greater, about twenty times (20×) greater, or about forty times (40×) greater. As a non-limiting example, the sacrificial structures 102 be formed of and include insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the sacrificial structures 102 is formed of and includes a dielectric nitride material, such as $SiN_y$ (e.g., $Si_3N_4$). Each of the sacrificial structures 102 may individually be substantially homogeneous or substantially heterogeneous.

The insulative structures 104 of the preliminary stack structure 101 may be formed of and include at least one insulative material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative structures 104 is formed of and includes a dielectric oxide material, such as $SiO_x$ (e.g., $SiO_2$). Each of the insulative structures 104 may individually be substantially homogeneous, may be or a substantially heterogeneous.

Still referring to FIG. 1, the insulative structures 104 may be doped with one or more chemical species (e.g., dopants) formulated to increase a difference between the etch rates of the insulative structures 104 and the sacrificial structures 102 at interfaces 106 between the insulative structures 104 and the sacrificial structures 102. For example, the chemical species may increase the resilience (e.g., resistance to an etchant) of the insulative structures 104 at the interfaces 106.

Figure 2:
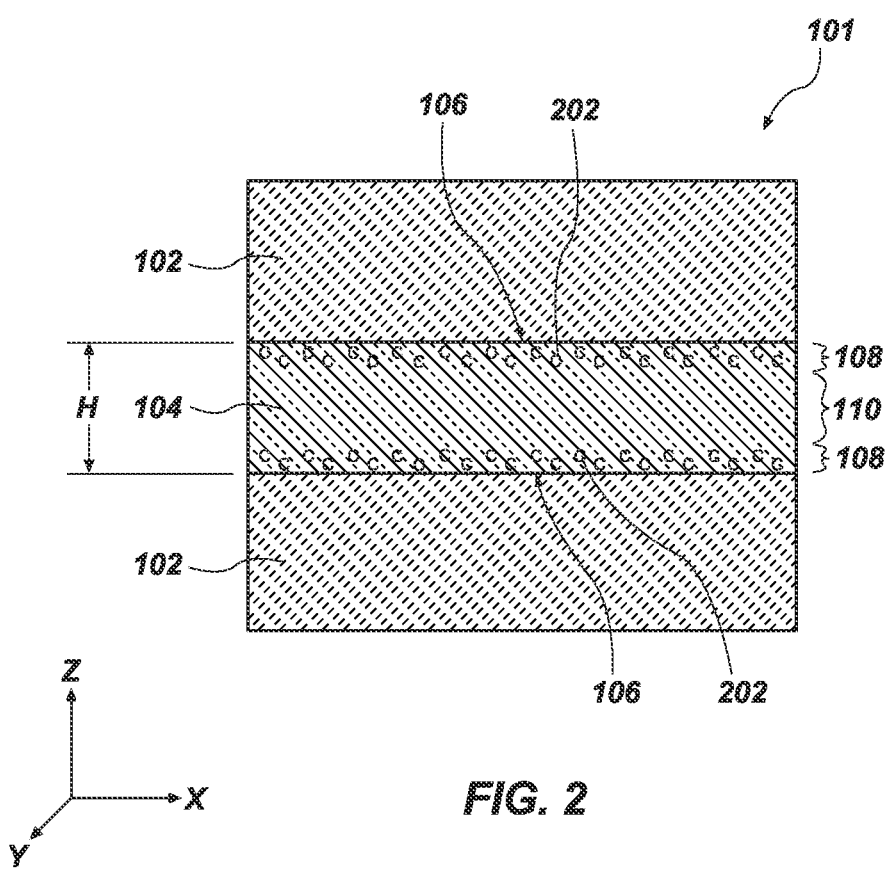
FIG. 2 illustrates an enlarged view of a section of the microelectronic device structure of FIG. 1.

FIG. 2 illustrates an enlarged side view of one of the insulative structures 104 between two of the sacrificial structures 102 shown in FIG. 1. The insulative structure 104 may include at least one dopant 202 dispersed within interfacial regions 108 inwardly vertically extending from the interfaces 106. A central region 110 of the insulative structure 104 interposed between the interfacial regions 108 may be substantially free of the dopant 202. The dopant 202 may be formulated to enhance the etch resistance of the interfacial regions 108 relative to the central region 110 to reduce undesirable voiding within the insulative structures 104. Non-limiting examples of suitable dopant 202 include one or more carbon and boron. The dopant 202 may also increase a rigidity of the insulative structures 104, which may help the insulative structures 104 to maintain their shape when the sacrificial structures 102 are removed (e.g., during subsequent replacement gate processing). Maintaining the shape of the insulative structures 104 when the sacrificial structures 102 are removed may substantially prevent undesirable tier collapse during and/or after the removal process.

A concentration of the dopant 202 within the interfacial regions 108 may be less than about 50% by volume, such as within a range of from about 1% by volume to about 30% by volume, or from about 20% by volume to about 30% by volume. In some embodiments, if the dopant 202 is carbon, the concentration of the dopant 202 within the interfacial regions 108 is within a range of from about 20% by volume to about 30% by volume. In additional embodiments if the dopant 202 is boron, the concentration of the dopant 202 within the interfacial regions 108 is within a range of from about 1% by volume to about 20% by volume.

To maintain a relatively lower concentration of the dopant 202 in the insulative structure 104, the insulative structure 104 may be formed in multiple distinct steps. In some embodiments, one or more precursor materials employed to form the interfacial regions 108 of the insulative structures 104 are different than one or more additional precursor materials employed to form the central regions 110 of the insulative structures 104. For example, one or more first precursor materials (e.g., silane ($SiH_4$) and oxygen ($O_2$)) for the formation of insulative material (e.g., $SiO_2$) of the insulative structure 104 may be combined with one or more second precursor materials (e.g., a carbon-containing precursor, such as one or more of carbon dioxide ($CO_2$) and methane ($CH_4$)) for the formation of the dopant 202 (e.g., carbon, boron), and may be deposited (e.g., through CVD) over one of the sacrificial structures 102 to form one of the interface regions 106 (including the dopant 202 therein) of the insulative structure 104. Thereafter, one or more third precursor materials (e.g., tetraethoxysilane (TEOS)) different than the first precursor materials may be deposited (e.g., through CVD), in the absence of the second precursor materials to form the central region 110 of the insulative structure 104 substantially free of the dopant 202. After forming the central region 110 of the insulative structure 104, additional amounts of the one or more first precursor materials and the one or more second precursor materials may be deposited (e.g., through additional CVD) to form the other of the interface regions 106 of the insulative structure 104.

Figure 3A:
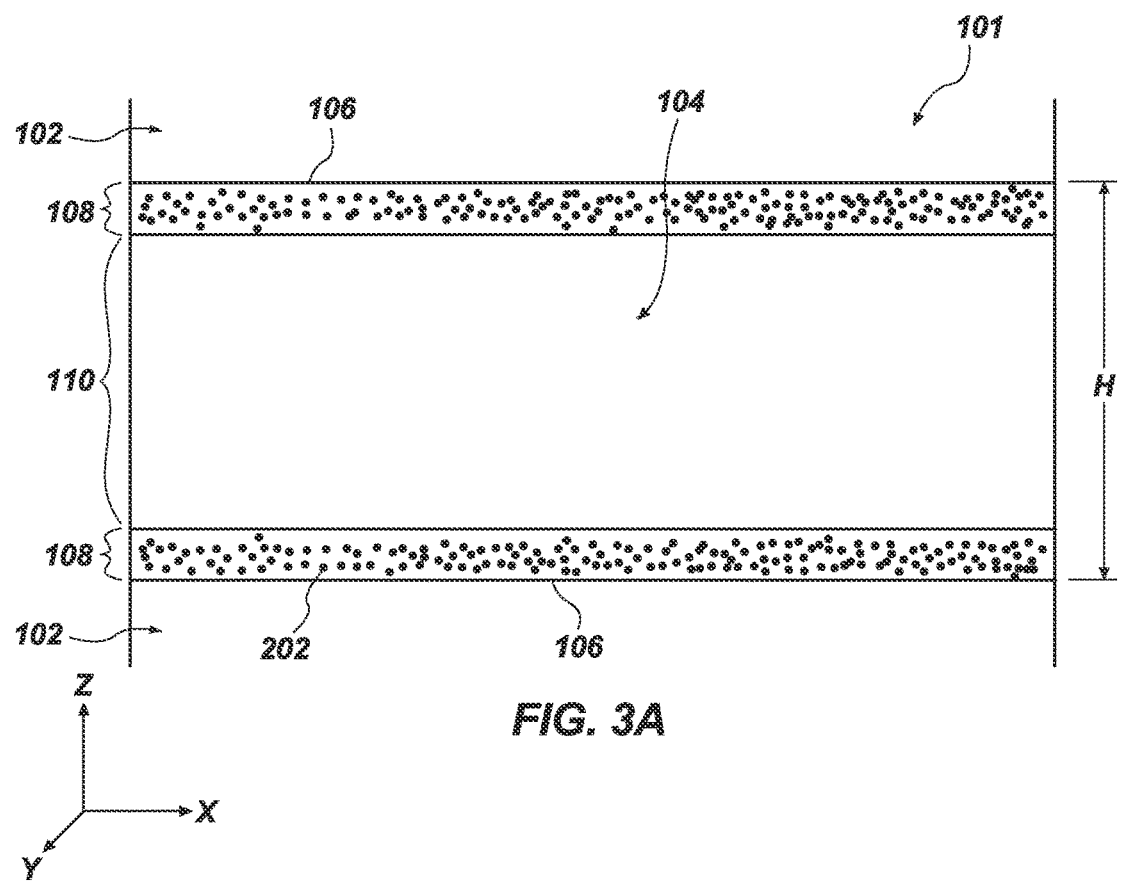
FIG. 3A illustrates an enlarged side view of one of the insulative structures of the microelectronic device structure of FIG. 1, as formed through a multi-step process, in accordance with embodiments of the disclosure.
Figure 3B:
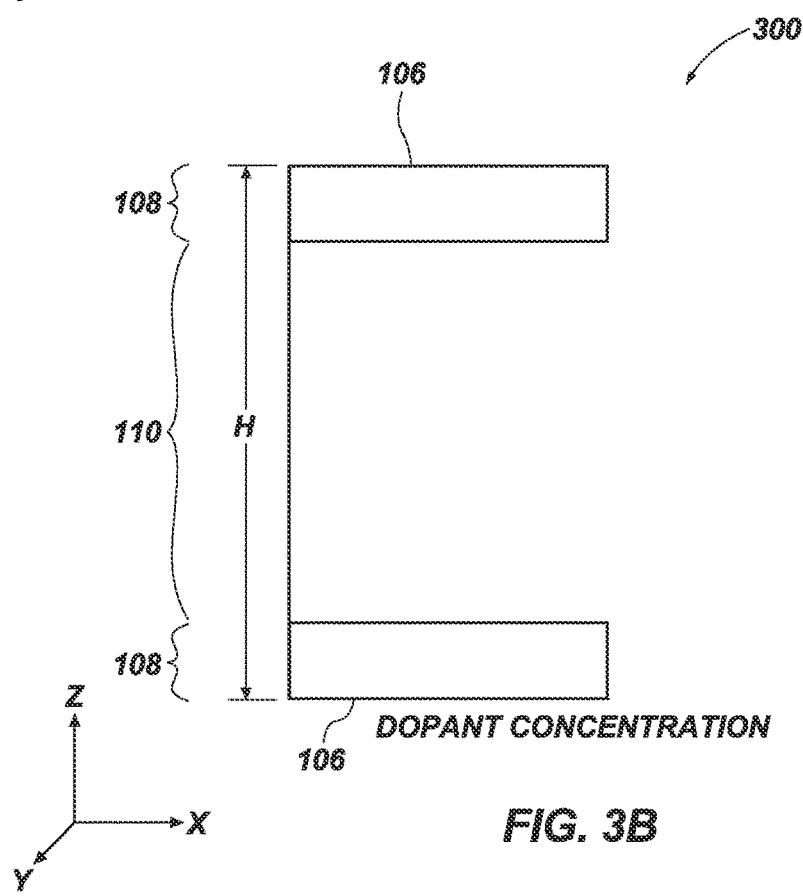
FIG. 3B illustrates a dopant concentration profile across a height of the insulative structure depicted in FIG. 3A.

FIG. 3A illustrates an enlarged side view of one of the insulative structures 104 formed through such a multi-step process. FIG. 3B illustrates a plot 300 showing a dopant concentration profile across a height H (e.g., vertical dimension) of the insulative structure 104. The multi-step process may result in a substantially uniform dopant concentration within each interfacial region 108 of the insulative structure 104. The central region 110 may be substantially free of dopant 202 (FIG. 3A), such that a dopant concentration throughout the central region 110 is substantially uniform and substantially equals zero.

In additional embodiments, one or more precursor materials employed to form the interfacial regions 108 of the insulative structures 104 are substantially the same as one or more precursor materials employed to form the central regions 110 of the insulative structures 104. For example, one or more first precursor materials (e.g., $SiH_4$ and $O_2$) for the formation of insulative material (e.g., $SiO_2$) of the insulative structure 104 may be combined with a one or more second precursor materials (e.g., a carbon-containing precursor, such as one or more of $CO_2$ and $CH_4$) for the formation of the dopant 202 (e.g., carbon, boron), and may be deposited (e.g., through CVD) over one of the sacrificial structures 102 to form one of the interface regions 106 (including the dopant 202 therein) of the insulative structure 104. Thereafter, one or more additional amounts of the one or more first precursor materials (e.g., $SiH_4$ and $O_2$) may be deposited (e.g., through CVD), in the absence of the second precursor materials to form the central region 110 of the insulative structure 104 substantially free of the dopant 202. After forming the central region 110 of the insulative structure 104, the further amounts of the one or more first precursor materials (e.g., $SiH_4$ and $O_2$) and the one or more second precursor materials (e.g., $CO_2$, $CH_4$) may be deposited (e.g., through additional CVD) to form the other of the interface regions 106 of the insulative structure 104.

Using the same first precursor materials (e.g., $SiH_4$ and $O_2$) for the formation of the interfacial regions 108 and the central regions 110 of the insulative structures 104 permits each insulative structure 104 to be formed through a single, continuous process (e.g., a single CVD process), which may reduce the time, complexity, and/or equipment for forming the insulative structures 104. For example, each insulative structure 104, including the interfacial regions 108 and the central region 110 thereof, may be formed in situ, and without a need to purge a deposition chamber (e.g., a CVD deposition chamber) of different precursor materials that may otherwise be employed for different regions (e.g., the interfacial regions 108 and the central region 110) of the insulative structure 104. For each interfacial region 108 of an individual insulative structure 104, the second precursor materials (e.g., $CO_2$, $CH_4$) may be introduced (e.g., pulsed) for a period of time less than about 20% of a total deposition time for the formation of the insulative structure 104, such as less than about 10% of the total deposition time.

Figure 4A:
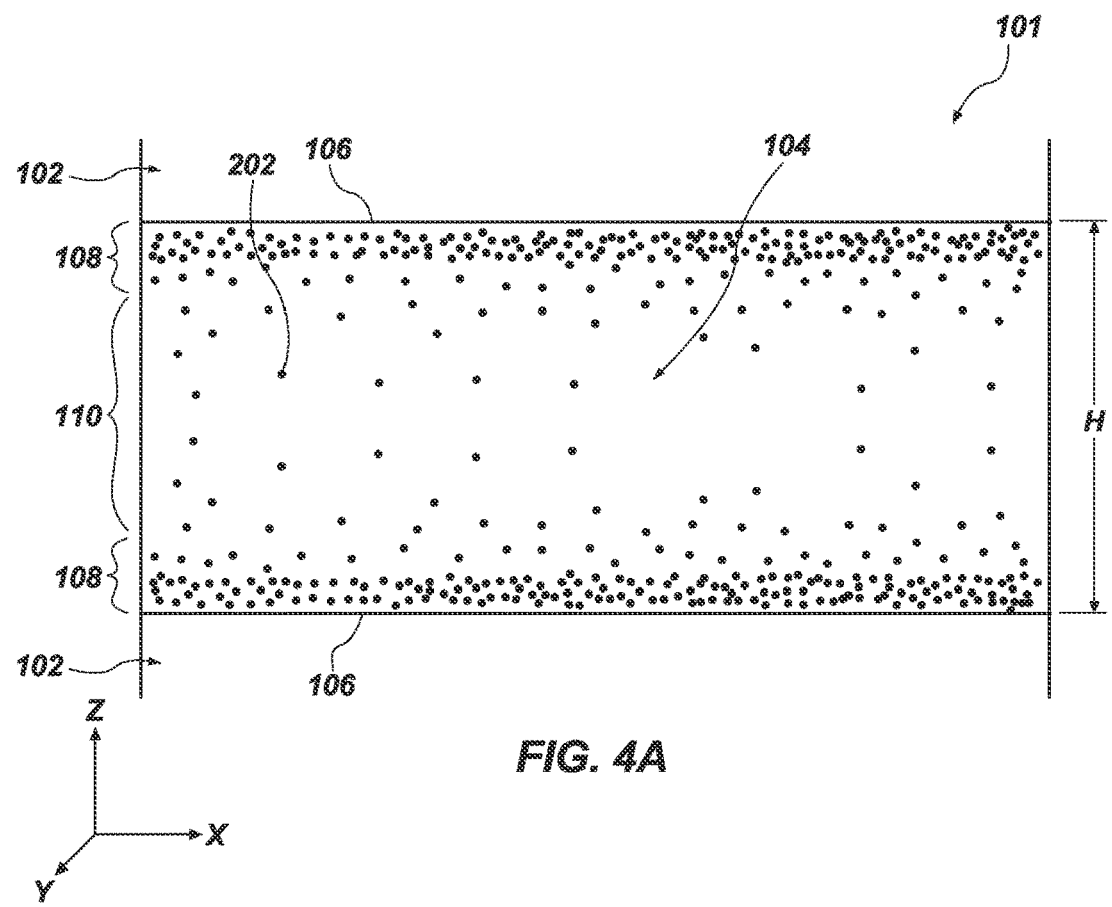
FIG. 4A is an enlarged side view of one of the insulative structures of the microelectronic device structure of FIG. 1, as formed through an addition multi-step process, in accordance with additional embodiments of the disclosure.
Figure 4B:
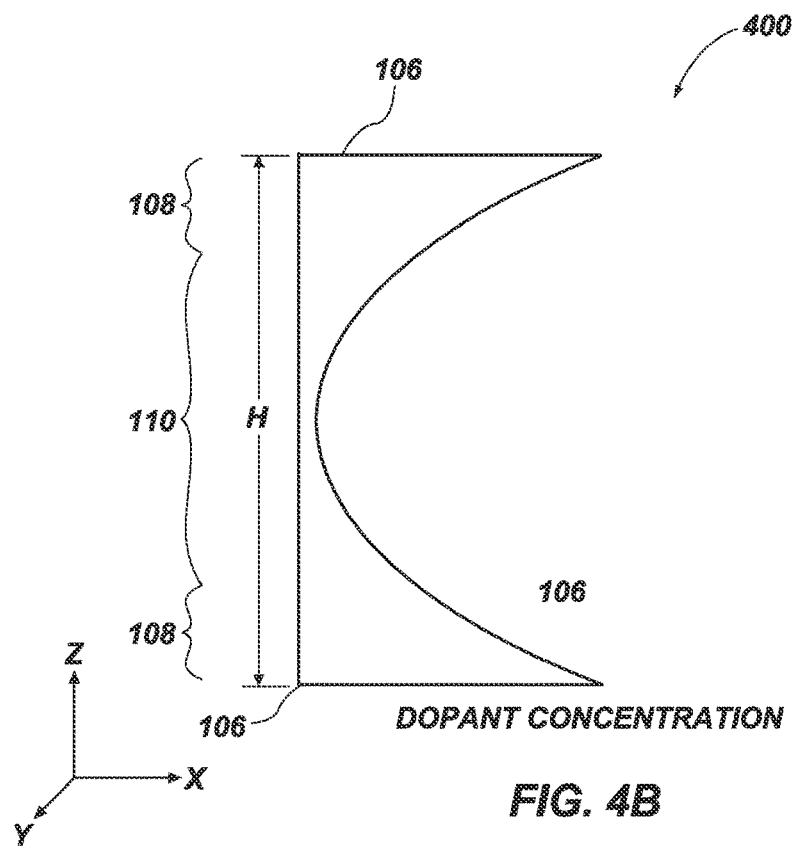
FIG. 4B illustrates a dopant concentration profile across a height of the insulative structure depicted in FIG. 4A.

FIG. 4A illustrates an enlarged side view of one of the insulative structures 104 formed through such a different multi-step process. FIG. 4B illustrates a plot 400 showing a dopant concentration profile across a height H (e.g., vertical dimension) of the insulative structure 104. The multi-step process may result in a variable (e.g., non-uniform) dopant concentrations within the interfacial regions 108 and the central region of an individual insulative structure 104. As illustrated in FIG. 4B, dopant concentration may be relatively greater near the interfaces 106 and may be relatively smaller near a center of the insulative structure 104. Since the first precursor materials (e.g., $SiH_4$ and $O_2$) and combined with the second precursor materials (e.g., c-containing precursor materials, such as $CO_2$ and/or $CH_4$; b-containing precursor materials) during the formation of the interfacial regions 108 of an individual insulative structure 104, relatively smaller amounts of the dopant 202 may be within the central region 110 of the insulative structure 104 as well. Lower dopant concentration within the central region 110 relative to the interfacial regions 108 may preserve desirable insulating properties of the insulative structure 104. In addition, higher dopant concentrations in the interfacial regions 108 relative to the central region 110 may enhance the rigidity and resistance to erosion portions of the insulative structure 104 proximate the interfaces 106.

Referring again to FIG. 2, each of the interfacial regions 108 of an individual insulative structure 104 may form less than about 20% of the entire height H of the insulative structure 104, such as between about 1% of the height H and about 20% of the height H, or between about 5% of the height H and about 10% of the height H. For example, a lower interfacial region 108 may constitute between about 10% and about 20% of the height H of the insulative structure 104; and an upper interfacial region 108 may constitute between about an additional 10% and about an additional 20% of the height H of the insulative structure 104. The central region 110 may constitute a remainder of the height H of the insulative structure 104, such as between about 60% and 80% of the height H of the insulative structure 104. In some embodiments, the interfacial regions 108 may each have a vertical dimension less than or equal to about 5 nm, such as within a range of from about 0.5 nm to about 2 nm.

Forming the insulative structure 104 through the methods of the disclosure permits dopant concentrations in the interfacial regions 108 and the central region 110 of individual insulative structures 104 to be controlled. For example, dopant concentration in the interfacial regions 108 may be controlled to be within a range of from about 1% by volume to about 30% by volume. The dopant concentration may be set based on material properties at the interfaces 106, such as material compositions of the sacrificial structures 102, material compositions of conductive structures to replace the sacrificial structures 102, material compositions of etchants to be used, and/or material compositions of the insulative structures 104. In some embodiments, the type of dopant used may define the dopant concentrations of the interfacial regions 108. For example, if the dopant is carbon, dopant concentrations of up to about 30% by volume may be effectuated; whereas if the dopant is boron, dopant concentrations of up to about 20% by volume may be effectuated. Furthermore, the effects of different dopants on the associated insulative material may be different. For example, one dopant may strengthen the insulative structure 104 and/or increase the resilience of the insulative structure 104 to a desired level at a lower concentration than another dopant. Other considerations, such as material property changes due to the dopant concentrations of the insulative structure 104 may define desired dopant concentration levels. For example, the dopants may increase conductivity of the insulative material, reducing the insulating properties of the insulative structure 104. The dopant concentration in the interfacial regions 108 and the central region 110 may be selected to balance the material properties and effects in the insulative structure 104.

After forming the preliminary stack structure 101, the sacrificial structures 102 may be at least partially (e.g., substantially) removed, such as through an etching process. As described above, the dopant 202 may enhance the etch resistance of the interfacial regions 108 of the insulative structures 104 to one or more etchants used to remove the sacrificial structures 102. With the sacrificial structures 102 removed a cavity (e.g., opening, void space) between the vertically neighboring insulative structures 104 may remain. The dopant 202 in the interfacial regions 108 of the insulative structures 104 may strengthen the insulative structures 104, such that the insulative structures 104 may substantially retain their shape when the sacrificial structures 102 are removed. The insulative structures 104 substantially retaining their shape may cause the remaining cavities to have substantially the same shape as the removed sacrificial structures 102.

Figure 5:
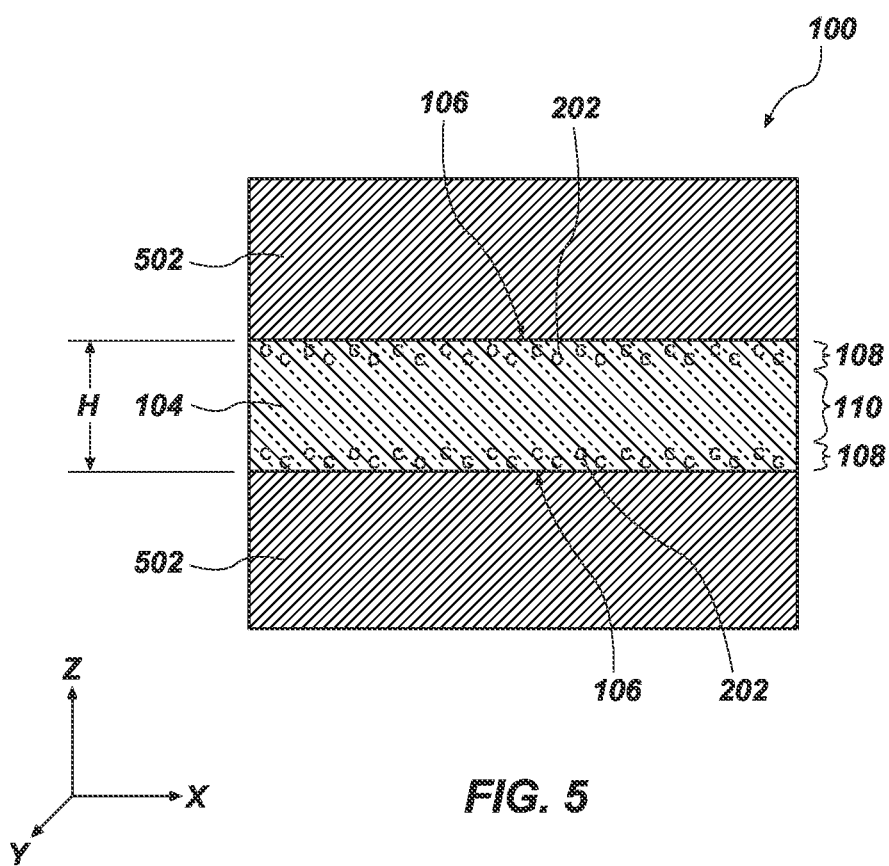
FIG. 5 illustrates the section of the microelectronic device structure shown in FIG. 2 following additional processing.

After the sacrificial structures 102 are removed, the cavities may be filled with conductive material to form conductive structures 502, as illustrated in FIG. 5. The conductive material may comprise, for example, one or more of at least one metal, at least one metal alloy, at least one conductive metal oxide, at least one conductive metal nitride, at least one conductive metal silicide, and at least one conductively-doped semiconductor material. By way of non-limiting example, the conductive structures 502 may be formed of and include one or more of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN$_x$), titanium silicide (TiSi$_x$), titanium silicon nitride (TiSi$_x$N$_y$), titanium aluminum nitride (TiAl$_x$N$_y$), molybdenum nitride (MoN$_x$), iridium (Ir), iridium oxide (IrO$_x$), ruthenium (Ru), ruthenium oxide (RuO$_x$), and conductively-doped silicon. In some embodiments, the conductive structures 502 are formed of and include W. In some embodiments, the conductive structures 502 are formed of and include TiN$_x$. In additional embodiments, the conductive structures 502 are formed of and include a metallic material including one or more of fluorine (F) and chlorine (Cl).

When the conductive structures 502 and/or precursor materials employed to form the conductive structures 502 include one or more of F and Cl, the dopant 202 within the interfacial regions 108 of the insulative structures 104 inhibit the migration (e.g., diffusion) of the F and/or the Cl into insulative structure 104. Accordingly, the interfacial regions 108 of the insulative structures 104 may substantially prevent the formation of voids within the insulative structures 104 that may otherwise result from the diffusion of the F and/or Cl in the insulative structures 104.

Thus, a microelectronic device according to embodiments of the disclosure includes conductive structures, and insulative structures vertically alternating with the conductive structures. At least one of the insulative structures includes interfacial regions extending inward from vertical boundaries of the at least one of the insulative structures. The interfacial regions are doped with one or more of carbon and boron. A central region of the insulative structures is vertically interposed between the interfacial regions and has a lower concentration of the one or more of carbon and boron than the interfacial regions.

In addition, in accordance with embodiments of the disclosure, a microelectronic device is formed to include at least two insulative structures separated from one another by at least one conductive structure. Interfacial regions within the insulative structures and proximate the conductive structure include at least one dopant (e.g., chemical species) dispersed therein. The dopant is selected to enhance the etch resistance of the interfacial regions to one or more etchants relative to additional (e.g., non-doped) regions of the insulative structures. Within an individual insulative structure, an individual interfacial region may extend to a depth (e.g., vertical height) at least about 0.5 nanometers (nm) from boundary (e.g., vertical boundary, such as a lower vertical boundary or an upper vertical boundary) of the insulative structure.

Furthermore, in accordance with embodiments of the disclosure, a method of forming a microelectronic device includes forming a first dielectric oxide structure through a chemical vapor deposition (CVD) process. The CVD process includes forming a first interfacial region through a first CVD act employing silane, oxygen, and one or more of carbon dioxide and methane. The CVD process further includes forming a central region over the first interfacial region through a second CVD act employing additional amounts of the silane and the oxygen in the absence of additional amounts of the carbon dioxide and the methane. The CVD process also includes forming a second interfacial region over the central region through a third CVD act employing further amounts of the silane and the oxygen and further amounts of one or more of the carbon dioxide and the methane. The method further includes forming a dielectric nitride structure over the first dielectric oxide structure. The method also includes forming a second dielectric oxide structure over the dielectric nitride structure. The method further includes selectively removing the dielectric nitride structure relative to the first dielectric oxide structure and the second dielectric oxide structure to form a void space from between the first dielectric oxide structure and the second dielectric oxide structure. The method also includes filling the void space with a conductive material.

Moreover, in accordance with embodiments of the disclosure, method of forming a microelectronic device includes forming a first material comprising insulative material doped with one or more of carbon and boron. The method further includes forming a second material over the first material and comprising the insulative material. The second material having a lower concentration of the one or more of carbon and boron than the first material. The method also includes forming a third material over the second material to form an insulative structure including the first material, the second material, and the third material. The third material comprising the insulative material doped with the one or more of carbon and boron. The method further includes forming a sacrificial structure over the insulative structure. The method also includes forming additional insulative structure over the sacrificial structure. The method further includes at least partially replacing the sacrificial structure with a conductive structure.

FIG. 6A through FIG. 6G are partial cross-sectional views illustrating different processing stages of a method of forming a microelectronic device, in accordance with embodiments of the disclosure. As described in further detail below, some of the processing stages described with reference to FIGS. 6A through 6G may be effectuated between the processing stage previously described with reference to FIGS. 1 through 4B and the processing stage previously described with reference to FIG. 5.

Figure 6A:
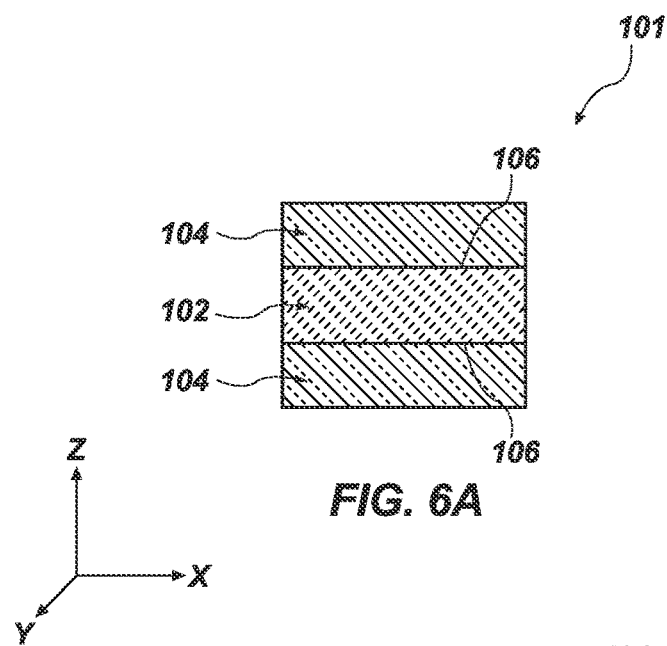
FIG. 6A through FIG. 6G illustrate enlarged side views of a microelectronic device structure at different process stages of a method of forming a microelectronic device, in accordance with embodiments of the disclosure.

Referring first to FIG. 6A, the preliminary stack structure 101 previously described with reference to FIGS. 1 through 4B, including sacrificial structures 102 and insulative structures 104 thereof, may be formed. The insulative structure 104 shown in FIG. 6A may, for example, be formed using the processing steps previously described reference to FIG. 3A and FIG. 3B or the processing steps previously described reference to FIG. 4A and FIG. 4B. As described above, the insulative structures 104 may include dopant 202 (FIGS. 2, 3A and 3B, 4A and 4B) in at least interfacial regions 108 (FIGS. 2, 3A and 3B, 4A and 4B) of the insulative structures 104 proximate the interfaces 106 between the insulative structures 104 and the sacrificial structures 102.

Figure 6B:
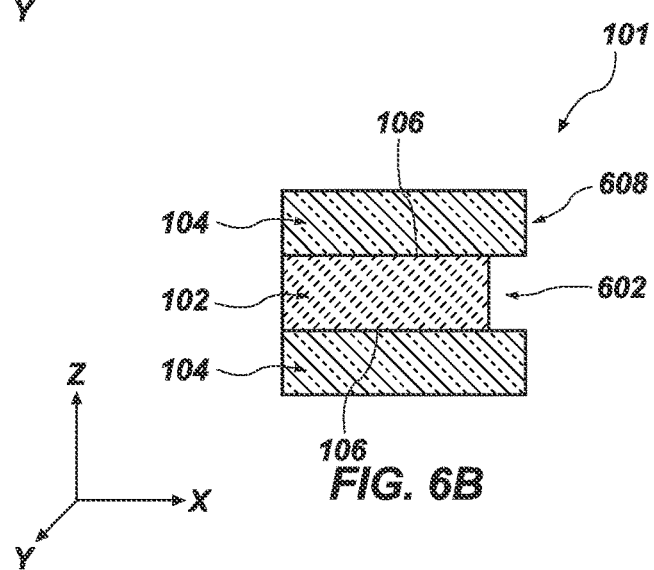

Referring next to FIG. 6B, after the preliminary stack structure 101 is formed, one or more openings may be formed in the preliminary stack structure 101, and recesses 602 may be formed in the sacrificial structures 102 by way of the openings. For example, as shown in FIG. 6B, one or more portions of an individual sacrificial structure 102 may be removed, such as through dry etching or wet etching from one or more lateral edges 608 (e.g., side surfaces, sidewalls) of the preliminary stack structure 101 exposed within an individual opening. The material removal process may be a selective process, such that sacrificial material (e.g., $Si_3N_4$) of the sacrificial structures 102 are removed without substantially removing insulative material (e.g., $SiO_2$, doped $SiO_2$) of the insulative structures 104. A horizontal depth (e.g., in the X-direction) of the recess 602 may be controlled through a duration of the material removal process. For example, a greater the duration of the material removal process a greater the horizontal depth of the recess 602 may be.

Figure 6C:
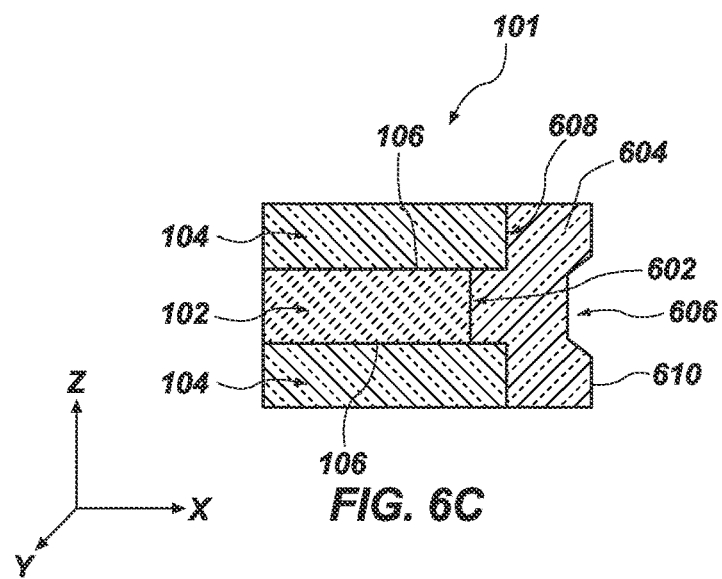

After forming the recess 602, blocking dielectric material 604 may be formed adjacent the modified lateral edges 608 (e.g., modified side surfaces, modified sidewalls) the preliminary stack structure 101, as illustrated in FIG. 6C. The blocking dielectric material 604 may be a substantially conformal coating along the modified lateral edges 608, such that the blocking dielectric material 604 conforms to the shapes of the modified lateral edges 608 and has a substantially uniform horizontal thickness throughout. The blocking dielectric material 604 may substantially fill the recess 602, and may include recess 606 in an outer surface 610 of the blocking dielectric material 604.

The blocking dielectric material 604 may be formed of and include an insulative material, such as at least one dielectric oxide material (e.g., $SiO_x$, such as $SiO_2$). The insulative material of the blocking dielectric material 604 may be substantially free from dopants. For example, the blocking dielectric material 604 may be formed from substantially the same insulative material as the insulative structure 104, but without the dopant 202 (FIGS. 2, 3A and 3B, and 4A and 4B). The blocking dielectric material 604 may be configured to prevent shorts between subsequently formed conductive structures around the outer lateral edge 608 of the adjoining insulative structures 104.

Figure 6D:
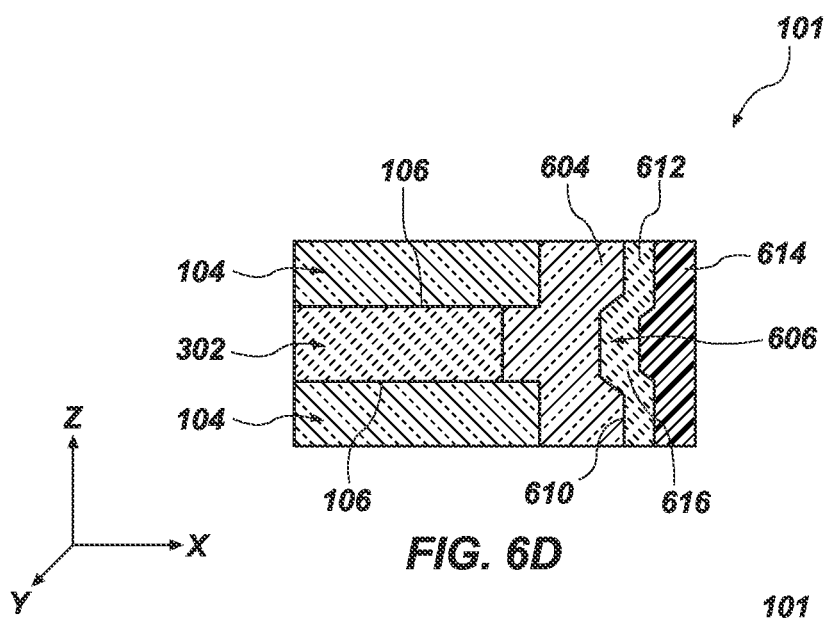

After the blocking dielectric material 604 is formed, a storage dielectric material 612 may be formed (e.g., conformally formed) on or over the blocking dielectric material 604, as illustrated in FIG. 6D. The storage dielectric material 612 may be formed of and include additional insulative material, such as a dielectric nitride material (e.g., $SiN_y$, such as $Si_3N_4$). The storage dielectric material 612 may substantially conform to the outer surface 610 of the blocking dielectric material 604, such that the storage dielectric material 612 include one or more recessed regions 616 therein. In addition, additional materials 614, such as one or more of additional insulative material protective films, and tunnel dielectric material films may be formed on or over the storage dielectric material 612.

The storage dielectric material 612 may be configured to store data through, for example, charge trapping. The storage dielectric material 612 may effectively store data by changing a charge state of the storage dielectric material 612. The recessed regions 616 of the storage dielectric material 612 may substantially prevent vertical movement of charge, since non-recessed regions of the storage dielectric material 612 are within vertical boundaries of insulative structures 104.

Figure 6E:
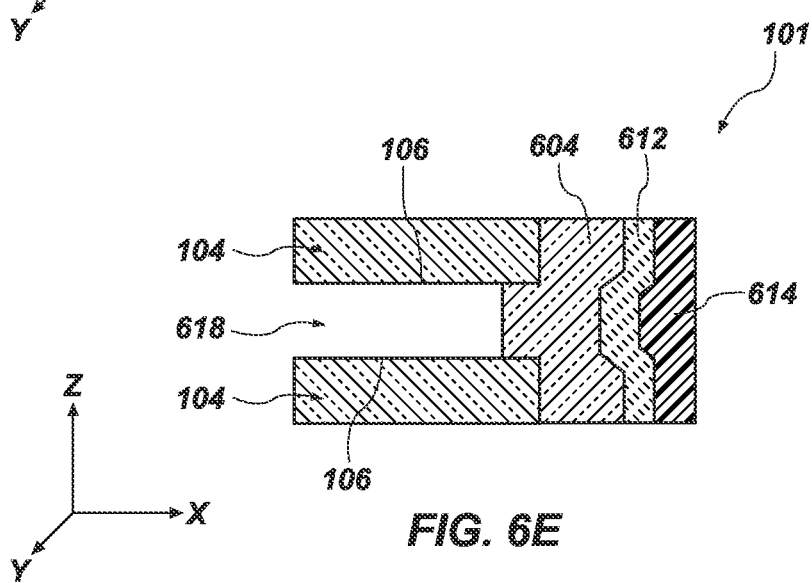

After the storage dielectric material 612 and the additional materials 614 are formed on or over the blocking dielectric material 604, the sacrificial structures 102 may be selectively removed, as illustrated in FIG. 6E. As described above, the sacrificial structures 102 may be at least partially (e.g., substantially) removed through a selective etching process, such as a wet etching process employing one or more wet etchants (e.g., phosphoric acid ($H_3PO_4$)) selected to etch sacrificial material of the sacrificial structures 102 faster than insulative material of the insulative structures 104. Furthermore, as described above, the interfacial regions 108 (FIGS. 2, 3A and 3B, 4A and 4B) of the insulative structures 104 proximate the interfaces 106 may include one or more dopants (e.g., C, B) formulated to enhance the etch resistance of the insulative structures 104 to the one or more etchants.

Figure 6F:
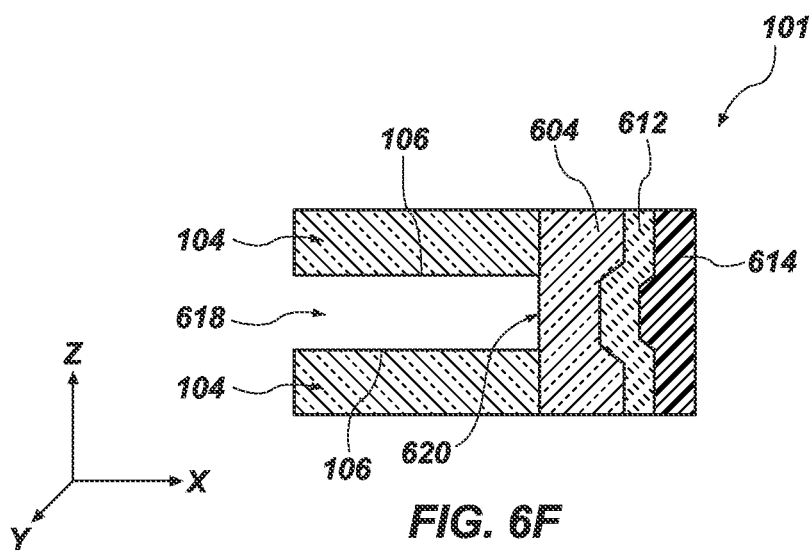

After the sacrificial structures 102 (FIG. 6E) are removed, cavities 618 (e.g., void spaces, air gaps) may remain vertically between the insulative structures 104. Optionally portions of the blocking dielectric material 604 may be removed (e.g., etched back) through the cavities 618, as illustrated in FIG. 6F. For example, portions of the blocking dielectric material 604 that filled the recesses 602 (FIG. 6B) may be removed, such that an inner surface 620 of the blocking dielectric material 604 is modified to be substantially coplanar with outer lateral edges of the insulative structures 104. The inner surface 620 of the blocking dielectric material 604 may be substantially planar, and the outer surface 610 (FIG. 6D) of the blocking dielectric material 604 may include the recess 606 (FIG. 6D) therein. After the portions of the blocking dielectric material 604 are removed, the blocking dielectric material 604 may not have a uniform horizontal thickness. The portions of the blocking dielectric material 604 corresponding to the recess 606 (FIG. 6D) may have a horizontal thickness that is less than portions of the blocking dielectric material 604 within vertical boundaries of the insulative structures 104.

Selective removal of the portion of the blocking dielectric material 604 relative to the insulative structures 104 may be facilitated by the doped regions of the insulative structures 104. For example, if the insulative material (e.g., $SiO_2$) of the insulative structures 104 and the blocking dielectric material 604 are substantially the same, the dopant 202 (FIGS. 2, 3A and 3B, 4A and 4B) (e.g., C, B) within the interfacial regions 108 (FIGS. 2, 3A and 3B, 4A and 4B) of the insulative structures 104 may cause the insulative structures 104 to have a relatively slower etch rate at or proximate the interfaces 106 than the blocking dielectric material 604, which may not include dopants similar to those within insulative structure 104. Thus, the selective etching process may be configured to remove the portion of the blocking dielectric material 604, while substantially maintaining the insulative structures 104.

Figure 6G:
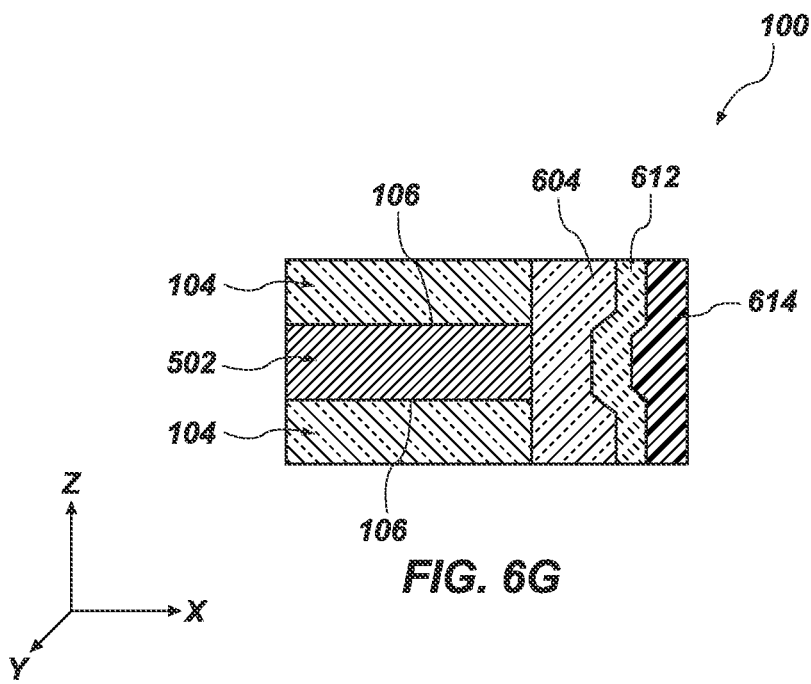

After the material removal processes, the cavity 618 may be filled with conductive material to form conductive structures 502, as illustrated in FIG. 6G. The conductive material may comprise, for example, one or more of at least one metal, at least one metal alloy, at least one conductive metal oxide, at least one conductive metal nitride, at least one conductive metal silicide, and at least one conductively-doped semiconductor material. By way of non-limiting example, the conductive structures 502 may be formed of and include one or more of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride ($TiN_x$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_x$), ruthenium (Ru), ruthenium oxide ($RuO_x$), and conductively-doped silicon. In some embodiments, the conductive structures 502 are formed of and include W. In some embodiments, the conductive structures 502 are formed of and include $TiN_x$. In additional embodiments, the conductive structures 502 are formed of and include a metallic material including one or more of F and Cl. As described above, the dopant 202 in the interfacial regions 108 of the insulative structure 104 may substantially prevent the diffusion of the F and Cl into the insulative material of the insulative structure 104, which may substantially prevent additional voiding from occurring during and/or after the formation of the conductive structures 502.

For an individual conductive structure 502, the conductive material thereof may extend to the inner surface 620 of the blocking dielectric material 604. The conductive structure 502 may also physically contact the one or more (e.g., two) of the insulative structures 104. The conductive structure 502 may be substantially vertically aligned with the recessed region 616 of the storage dielectric material 612 and the recess 606 of the blocking dielectric material 604. Changes to the charge in the conductive structure 502 may change the charge in the recessed region 616 of the storage dielectric material 612 due to the proximity of the conductive structure 502 to the recessed region 616 of the storage dielectric material 612. Thus, the storage dielectric material 612 may be configured to transmit data signals to and/or from the conductive structure 502 through charge trapping.

In additional embodiments, the recesses 602 previously described with reference to FIG. 6B are not formed. Accordingly, the lateral edges 608 (e.g., side surfaces, sidewalls) of the preliminary stack structure 101 may be substantially planar, such that lateral edges of the insulative structures 104 are substantially coplanar with lateral edges of the sacrificial structures 102. As a result, at a processing stage corresponding to that of FIG. 6G, the microelectronic device structure 100 have instead exhibit the configuration illustrated in FIG. 7. In some such embodiments, the process of forming the microelectronic device structure 100 shown in FIG. 7 includes forming a blocking dielectric material 604' (corresponding to the blocking dielectric material 604 (FIG. 6C)) on or over the substantially planar lateral edges 608 of the preliminary stack structure 101 in a similar manner to that described above with respect to FIG. 6C. Thereafter, a storage dielectric material 612' (corresponding to the storage dielectric material 612 (FIG. 6D)) may be formed over the blocking dielectric material 604', and additional materials 614' (corresponding to the additional materials 614 (FIG. 6D)) may be formed over the storage dielectric material 612' in substantially the same manner described above with respect to FIG. 6D. The microelectronic device structure 100 may then be subjected to additional processing, in a manner substantially similar to that described above with reference to FIGS. 6E-6G, to form the microelectronic device structure 100 at the processing stage depicted in FIG. 7. In the microelectronic device structure 100 of FIG. 7 horizontal offsets between lateral edges of vertically neighboring conductive structures 502 and insulative structures 104 may be less than about 5 angstroms (Å), such as less than about 3 Å. In other words, lateral edges of vertically neighboring conductive structures 502 and insulative structures 104 may be substantially horizontally aligned with one another.

Thus, in accordance with additional embodiments of the disclosure, a method of forming a microelectronic device includes forming a first dielectric structure including one or more of carbon and boron disposed proximate vertical boundaries thereof. A sacrificial structure is formed on the first dielectric structure. A second dielectric structure is formed on the sacrificial structure, the second dielectric structure including one or more of additional carbon and additional boron disposed proximate vertical boundaries thereof. At least one opening is formed to extend through the first dielectric structure, the sacrificial structure, and the second dielectric structure. A portion of the sacrificial structure is selectively removed relative to the first dielectric structure and the second dielectric structure by way of the at least one opening. The method may further include forming a blocking dielectric material over surfaces of the first dielectric structure after selectively removing the portion of the sacrificial structure, the sacrificial structure, and the second dielectric structure exposed within the opening. The method may also include removing a remaining portion of the sacrificial structure after forming the blocking dielectric material to form a void space. The method may further include selectively removing a portion of the blocking dielectric material by way of the void space until an inner side surface of the blocking dielectric material is substantially aligned with an outer side surfaces of the first dielectric structure and the second dielectric structure. The method may also include filling the void space with a conductive material after removing the portion of the blocking dielectric material.

Figure 7:
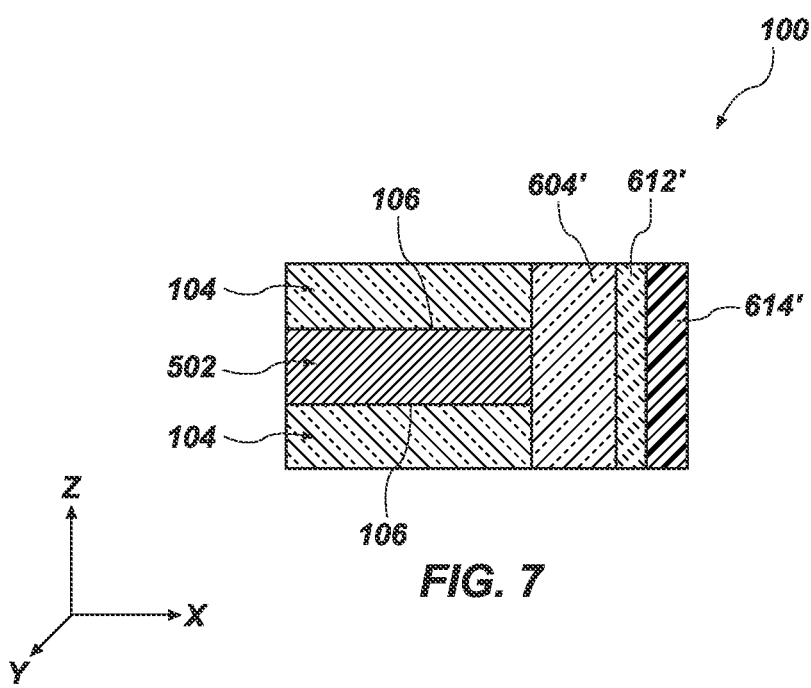
FIG. 7 is an enlarged side view of a microelectronic device structure, in accordance with additional embodiments of the disclosure.
Figure 8:
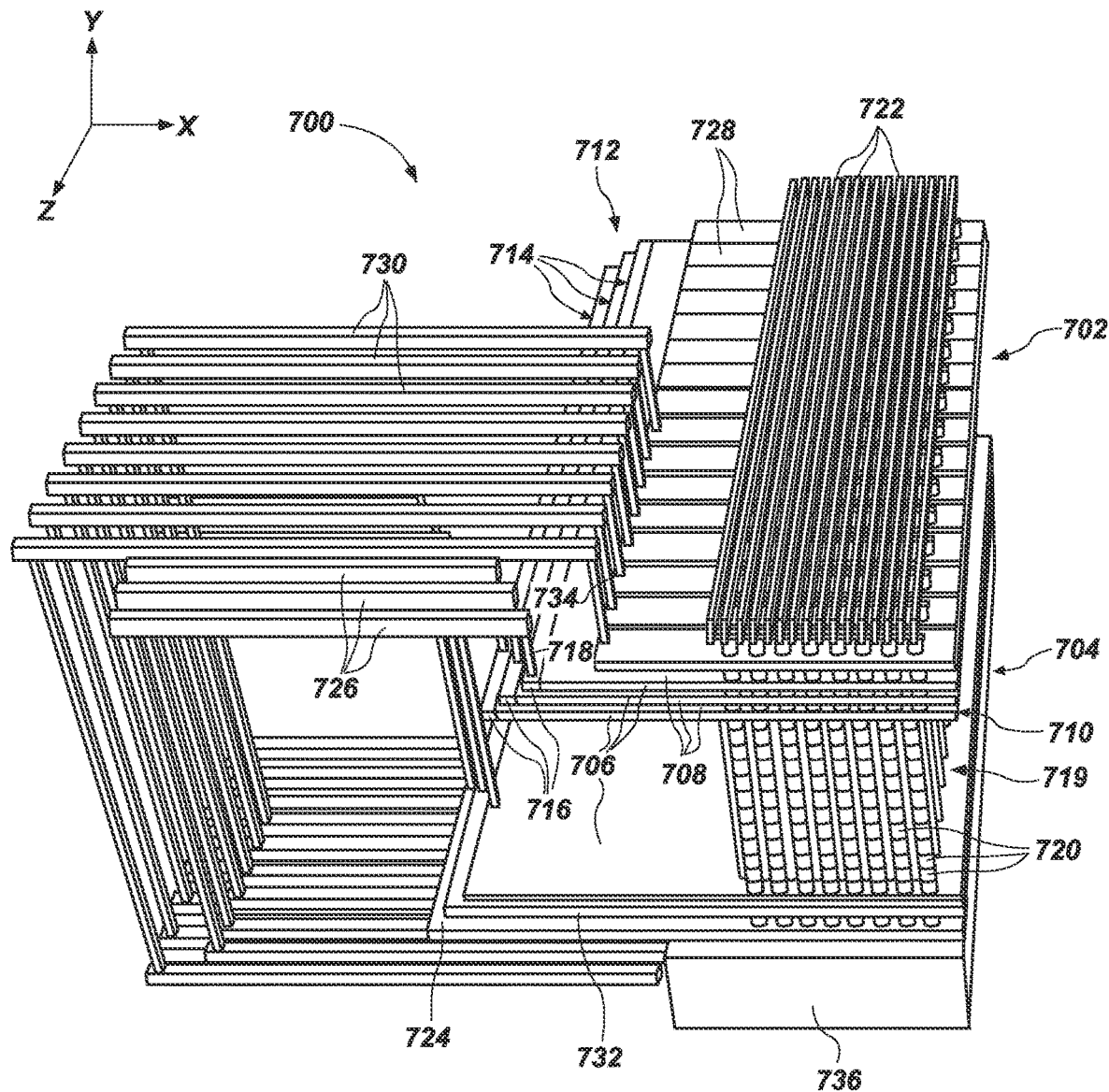
FIG. 8 is a partial, cutaway perspective view of a microelectronic device, in accordance with embodiments of the disclosure.

Microelectronic device structures (e.g., the microelectronic device structure 100 previously described with reference to FIG. 5, FIG. 6G, and/or FIG. 7) of the disclosure may be included in microelectronic devices of the disclosure. For example, FIG. 8 illustrates a partial cutaway perspective view of a portion of a microelectronic device 700 (e.g., a memory device, such as a 3D NAND Flash memory device) including a microelectronic device structure 702. The microelectronic device structure 702 may be substantially similar to the microelectronic device structure 100 at the processing stage previously described with reference to FIG. 5, FIG. 6G, and/or FIG. 7. In some embodiments, the microelectronic device structure 702 is formed through the processes previously described with reference to FIGS. 1 through 6G.

As shown in FIG. 8, the microelectronic device structure 702 may include a stack structure 704 including a vertically alternating (e.g., in the Z-direction) sequence of conductive structures 706 and insulative structures 708 arranged in tiers 710; a staircase structure 712 having steps 714 defined by edges (e.g., horizontal ends in the X-direction) of the tiers 710; composite pad structures 716 on portions of the tiers 710 of the stack structure 704 at the steps 714 of the staircase structure 712; and contact structures 718 extending through the composite pad structures 716 and contacting (e.g., physically contacting, electrically contacting) to the conductive structures 706 of the tiers 710 of the stack structure 704 at the steps 714 of the staircase structure 712. The stack structure 704, the conductive structures 706, and the insulative structures 708 may respectively be substantially similar to the stack structure 101, the conductive structures 502, and the insulative structures 104 at the processing stage previously described with reference to FIG. 5, FIG. 6G, and/or FIG. 7. The microelectronic device 700 also includes additional features (e.g., structures, devices) operatively associated with the microelectronic device structure 702, as described in further detail below.

The microelectronic device 700 may further include vertical strings 719 of memory cells 720 coupled to each other in series, such as through the openings in the stack structure 101 previously described with reference to FIG. 6G. The microelectronic device 700 may also include digit line structures 722 (e.g., bit line structures), a source structure 724, access line routing structures 726, first select gates 728 (e.g., upper select gates, drain select gates (SGDs)), select line routing structures 730, second select gates 732 (e.g., lower select gates, source select gates (SGSs)), and additional contact structures 734. The vertical strings 719 of memory cells 720 extend vertically and orthogonal to conductive lines and tiers (e.g., the digit line structures 722, the source structure 724, the tiers 710 of the stack structure 704, the access line routing structures 726, the first select gates 728, the select line routing structures 730, the second select gates 732). In some embodiments, the memory cells 720 comprise so-called "MONOS" (metal-oxide-nitride-oxide-semiconductor) memory cells. In additional embodiments, the memory cells 720 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 720 comprise so-called "floating gate" memory cells. The conductive contact structures 718 and the additional contact structures 734 may electrically couple components to each other as shown (e.g., the select line routing structures 730 to the first select gates 728, the access line routing structures 726 to the tiers 710 of the stack structure 704 of the microelectronic device structure 702).

The microelectronic device 700 may also include a base structure 736 positioned vertically below the vertical strings 719 of memory cells 720. The base structure 736 may include at least one control logic region including control logic devices configured to control various operations of other features (e.g., the vertical strings 719 of memory cells 720) of the microelectronic device 700. As a non-limiting example, the control logic region of the base structure 736 may further include one or more (e.g., each) of charge pumps (e.g., VCCP charge pumps, VNEGWL charge pumps, DVC2 charge pumps), delay-locked loop (DLL) circuitry (e.g., ring oscillators), Vdd regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 736 may be coupled to the source structure 724, the access line routing structures 726, the select line routing structures 730, and the digit line structures 722. In some embodiments, the control logic region of the base structure 736 includes CMOS (complementary metal-oxide-semiconductor) circuitry. In such embodiments, the control logic region of the base structure 736 may be characterized as having a "CMOS under Array" ("CuA") configuration.

Figure 9:
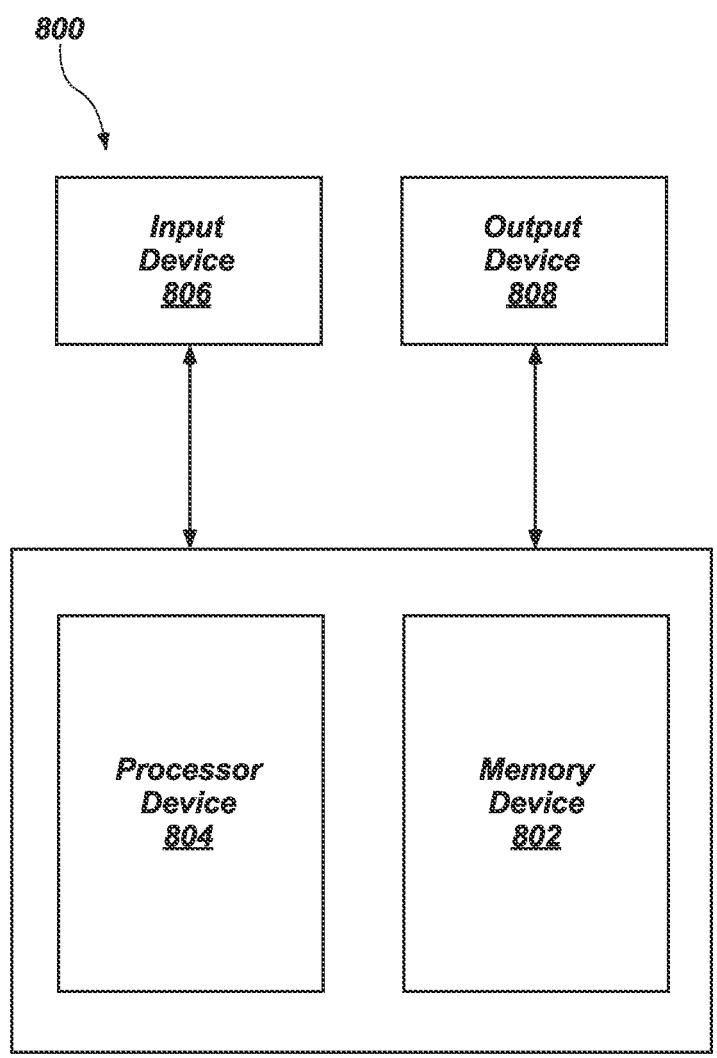
FIG. 9 is a schematic block diagram of an electronic system in accordance with one or more embodiments of the disclosure.

Microelectronic device structures (e.g., the microelectronic device structure 100 (FIG. 5, FIG. 6G, and/or FIG. 7)) and microelectronic devices (e.g., the microelectronic device 700 (FIG. 8)) of the disclosure may be included in embodiments of electronic systems of the disclosure. For example, FIG. 9 is a block diagram of an electronic system 800, in accordance with embodiments of the disclosure. The electronic system 800 may comprise, for example, a computer or computer hardware component, a server or other networking hardware component, a cellular telephone, a digital camera, a personal digital assistant (PDA), portable media (e.g., music) material, a Wi-Fi or cellular-enabled tablet such as, for example, an iPAD® or SURFACE® tablet, an electronic book, a navigation device, etc. The electronic system 800 includes at least one memory device 802. The memory device 802 may include, for example, an embodiment of a microelectronic device structure (e.g., the microelectronic device structure 100 (FIG. 5)) and a microelectronic device (e.g., the microelectronic device 700 (FIG. 8)) previously described herein.

The electronic system 800 may further include at least one electronic signal processor device 804 (often referred to as a "microprocessor"). The electronic signal processor device 804 may, optionally, include an embodiment of one or more of a microelectronic device and a microelectronic device structure previously described herein. The electronic system 800 may further include one or more input devices 806 for inputting information into the electronic system 800 by a user, such as, for example, a mouse or other pointing device, a keyboard, a touchpad, a button, or a control panel. The electronic system 800 may further include one or more output devices 808 for outputting information (e.g., visual or audio output) to a user such as, for example, a monitor, a display, a printer, an audio output jack, a speaker, etc. In some embodiments, the input device 806 and the output device 808 may comprise a single touchscreen device that can be used both to input information to the electronic system 800 and to output visual information to a user. The input device 806 and the output device 808 may communicate electrically with one or more of the memory device 802 and the electronic signal processor device 804.

Figure 10:
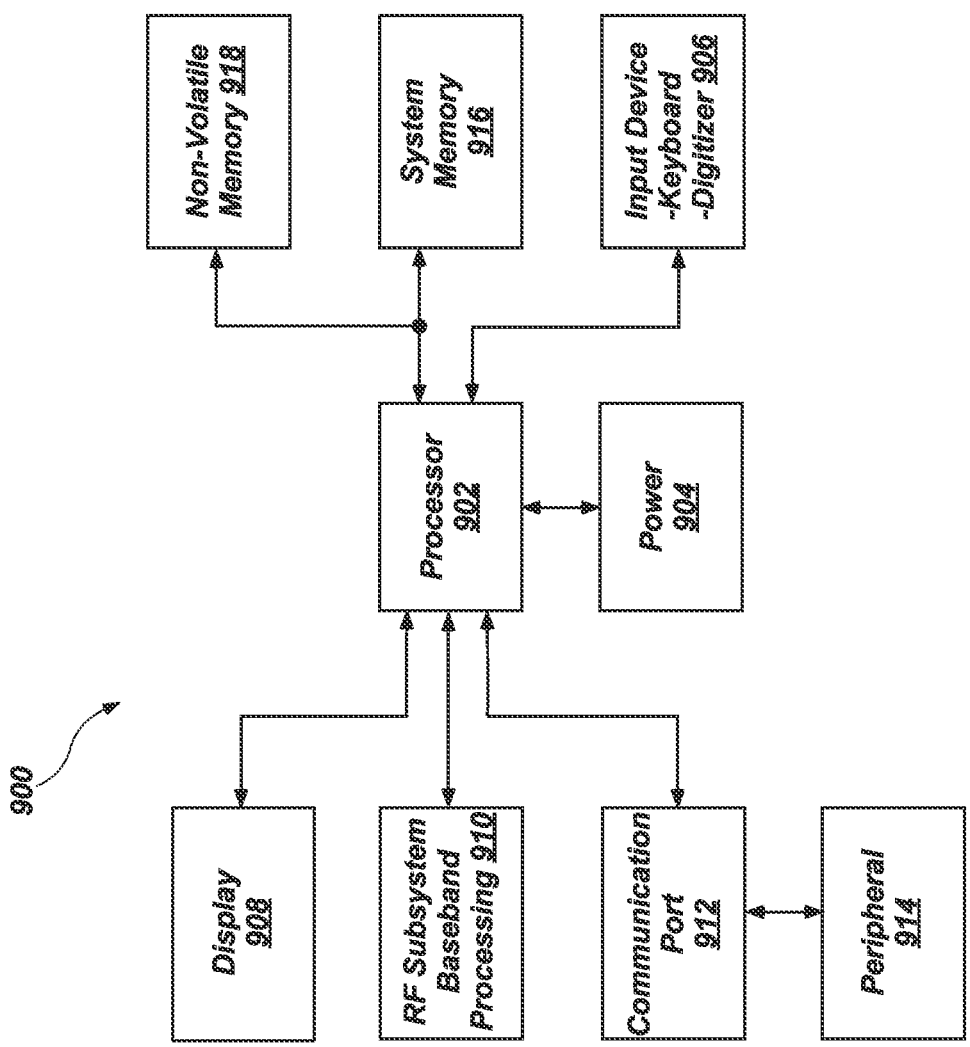
FIG. 10 is a schematic block diagram of a processor-based system in accordance with one or more embodiments of the disclosure.

With reference to FIG. 10, depicted is a processor-based system 900 of the disclosure. The processor-based system 900 may include one or more of a microelectronic device structure and a microelectronic device (e.g., the microelectronic device structure 100 (FIG. 5, FIG. 6B, and/or FIG. 7)) and a microelectronic device (e.g., the microelectronic device 700 (FIG. 8)) previously described herein and manufactured in accordance with embodiments of the disclosure. The processor-based system 900 may be any of a variety of types such as a computer, pager, cellular phone, personal organizer, control circuit, or other electronic device. The processor-based system 900 may include one or more processors 902, such as a microprocessor, to control the processing of system functions and requests in the processor-based system 900. The processor 902 and other subcomponents of the processor-based system 900 may include one or more of microelectronic device structure and a microelectronic device previously described herein and manufactured in accordance with embodiments of the disclosure.

The processor-based system 900 may include a power supply 904 in operable communication with the processor 902. For example, if the processor-based system 900 is a portable system, the power supply 904 may include one or more of a fuel cell, a power scavenging device, permanent batteries, replaceable batteries, and rechargeable batteries. The power supply 904 may also include an AC adapter; therefore, the processor-based system 900 may be plugged into a wall outlet, for example. The power supply 904 may also include a DC adapter such that the processor-based system 900 may be plugged into a vehicle cigarette lighter or a vehicle power port, for example.

Various other devices may be coupled to the processor 902 depending on the functions that the processor-based system 900 performs. For example, a user interface 906 may be coupled to the processor 902. The user interface 906 may include input devices such as buttons, switches, a keyboard, a light pen, a mouse, a digitizer and stylus, a touch screen, a voice recognition system, a microphone, or a combination thereof. A display 908 may also be coupled to the processor 902. The display 908 may include an LCD display, an SED display, a CRT display, a DLP display, a plasma display, an OLED display, an LED display, a three-dimensional projection, an audio display, or a combination thereof. Furthermore, an RF sub-system/baseband processor 910 may also be coupled to the processor 902. The RF sub-system/baseband processor 910 may include an antenna that is coupled to an RF receiver and to an RF transmitter (not shown). A communication port 912, or more than one communication port 912, may also be coupled to the processor 902. The communication port 912 may be adapted to be coupled to one or more peripheral devices 914, such as a modem, a printer, a computer, a scanner, or a camera, or to a network, such as a local area network, remote area network, intranet, or the Internet, for example.

The processor 902 may control the processor-based system 900 by implementing software programs stored in the memory. The software programs may include an operating system, database software, drafting software, word processing software, media editing software, or media playing software, for example. The memory is operably coupled to the processor 902 to store and facilitate execution of various programs. For example, the processor 902 may be coupled to system memory 916, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 916 may include volatile memory, non-volatile memory, or a combination thereof. The system memory 916 is typically large so that it can store dynamically loaded applications and data. In some embodiments, the system memory 916 may include semiconductor devices, such as one or more of a microelectronic device previously described herein.

The processor 902 may also be coupled to non-volatile memory 918, which is not to suggest that system memory 916 is necessarily volatile. The non-volatile memory 918 may include one or more of STT-MRAM, MRAM, read-only memory (ROM) such as an EPROM, resistive read-only memory (RROM), and flash memory to be used in conjunction with the system memory 916. The size of the non-volatile memory 918 is typically selected to be just large enough to store any necessary operating system, application programs, and fixed data. Additionally, the non-volatile memory 918 may include a high-capacity memory such as disk drive memory, such as a hybrid-drive including resistive memory or other types of non-volatile solid-state memory, for example. The non-volatile memory 918 may include microelectronic devices, such as one or more of a microelectronic device previously described herein.

Thus, an electronic system according to embodiments of the disclosure includes an input device, an output device, a processor device operably connected to the input device and the output device, and a memory device operably connected to the processor device. The memory device includes a stack structure comprising conductive structures vertically alternating with insulative structures. At least one of the insulative structures individually includes interfacial regions extending inward from interfaces of the at least one of the insulative structures and at least two of the conductive structures; and an additional region between the interfacial regions. The interfacial regions are doped with one or more of carbon and boron. The additional region includes a lower concentration of the one or more of carbon and boron than each of the interfacial regions. The memory device further includes a source structure underlying the stack structure; digit line structures overlying the stack structure; strings of memory cells extending through the stack structure and coupled to the source structure and the digit line structures; and control logic circuitry underlying the source structure and coupled to the conductive contact structures.

As compared to conventional structures, conventional devices, and conventional methods, the structures, devices, and methods of disclosure may facilitate enhanced strength, rigidity, and/or resilience of insulative structures of stack structure including the insulative structure alternating with conductive structures. Enhancing the strength, rigidity, and/or resilience of the insulative structures may enable a thickness of the insulative structures to be reduced relative to conventional insulative structures. Reducing the thickness of the insulative structures may permit a feature density of a microelectronic device including the insulative structures to increase. Increasing a feature density of the microelectronic device may permit the microelectronic device to be smaller, which in turn may permit associated electronic systems to be smaller than conventional electronic systems. In addition, the structures, devices, and methods of the disclosure may facilitate increased performance without an increase in size relative to conventional structures and conventional devices. Furthermore, the structures, devices, and methods of the disclosure may facilitate increased yield relative to conventional structures, conventional devices, and conventional methods.

The embodiments of the disclosure described above and illustrated in the accompanying drawing figures do not limit the scope of the invention, since these embodiments are merely examples of embodiments of the invention, which is defined by the appended claims and their legal equivalents. Any equivalent embodiments are intended to be within the scope of this disclosure. Indeed, various modifications of the present disclosure, in addition to those shown and described herein, such as alternative useful combinations of the elements described, may become apparent to those skilled in the art from the description. Such modifications and embodiments are also intended to fall within the scope of the appended claims and their legal equivalents.

What is claimed is:

1. A microelectronic device, comprising:
   conductive structures; and
   insulative structures vertically alternating with the conductive structures, at least one of the insulative structures comprising:
      interfacial regions extending inward from vertical boundaries of the at least one of the insulative structures, the interfacial regions doped with one or more of carbon and boron; and
      a central region vertically interposed between the interfacial regions and comprising a lower concentration of the one or more of carbon and boron than the interfacial regions.

2. The microelectronic device of claim 1, wherein each of the interfacial regions of the at least one of the insulative structures individual vertically extend to a depth of at least 0.5 nanometers from a vertical boundaries of the at least one of the insulative structures.

3. The microelectronic device of claim 1, wherein each of the insulative structures comprises silicon dioxide.

4. The microelectronic device of claim 3, wherein the interfacial regions of each of the insulative structures comprise carbon-doped silicon dioxide.

5. The microelectronic device of claim 4, wherein the central region of the at least one of the insulative structures is substantially free of carbon and boron.

6. The microelectronic device of claim 1, wherein amounts of the one or more of carbon and boron within the interfacial regions of the at least one of the insulative structures increase in directions extending away from the central region of the at least one of the insulative structures.

7. The microelectronic device of claim 1, wherein a concentrations of the one or more of carbon and boron within the interfacial regions of the at least one of the insulative structures is within a range of from about 1% by volume to about 30% by volume.

8. An electronic system comprising:
   an input device;
   an output device;
   a processor device operably connected to the input device and the output device; and
   a memory device operably connected to the processor device and comprising:
      a stack structure comprising conductive structures vertically alternating with insulative structures, at least one of the insulative structures individually comprising:
         interfacial regions extending inward from interfaces of the at least one of the insulative structures and at least two of the conductive structures, the interfacial regions doped with one or more of carbon and boron; and
         an additional region between the interfacial regions and comprising a lower concentration of the one or more of carbon and boron than each of the interfacial regions;
      a source structure underlying the stack structure;
      digit line structures overlying the stack structure;
      strings of memory cells extending through the stack structure and coupled to the source structure and the digit line structures; and
      control logic circuitry underlying the source structure and coupled to the conductive structures.

9. The electronic system of claim 8, wherein the interfacial regions of the at least one of the insulative structures together comprise from about 20% to about 40% of a total vertical thickness of the at least one of the insulative structures.

10. The electronic system of claim 8, wherein the interfacial regions of the at least one of the insulative structures individually have a non-uniform distribution of the one or more of carbon and boron across a vertical thickness thereof.

11. The electronic system of claim 8, wherein the interfacial regions of the at least one of the insulative structures individually have a substantially uniform distribution of the one or more of carbon and boron across a vertical thickness thereof.

* * * * *